(12) United States Patent
Kim

(10) Patent No.: US 6,774,495 B2
(45) Date of Patent: Aug. 10, 2004

(54) SOLDER TERMINAL AND FABRICATING METHOD THEREOF

(75) Inventor: Jong-Heon Kim, Chungcheongbuk-do (KR)

(73) Assignee: CCUBE Digital Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 10/279,383

(22) Filed: Oct. 23, 2002

(65) Prior Publication Data

US 2004/0080049 A1 Apr. 29, 2004

(51) Int. Cl.[7] .............................................. H01L 23/48
(52) U.S. Cl. .................. 257/780; 257/750; 257/751; 257/761; 257/762; 257/763; 257/764; 257/765; 257/766; 257/737; 257/778; 257/779
(58) Field of Search ................................ 257/778–780, 257/750–751, 761–766, 737, 738, 783, 767

(56) References Cited

U.S. PATENT DOCUMENTS 6,232,212 B1 * 5/2001 Degani et al. .............. 438/612

6,452,270 B1 * 9/2002 Huang ......................... 257/738

* cited by examiner

*Primary Examiner*—Luan Thai
(74) *Attorney, Agent, or Firm*—Marger Johnson & McCollom, P.C.

(57) ABSTRACT

A solder terminal and a fabrication method thereof are provided. According to one embodiment of the present invention, a solder terminal structure includes an adhesion metal layer formed on an electrode pad of a semiconductor device, a thermal diffusion barrier, a solder bonding layer, and a solder bump formed on upper portion of the solder bonding layer. With the thermal diffusion layer, the characteristic deterioration caused by the probe mark generated on the electrode pad can be prevented during a semiconductor reliability test, and at the same time, material movement between the layers of the electrode pad, the solder bonding layer and the adhesion metal layer can be reduced. Also, by having the thermal diffusion barrier act as a solder dam (a layer to confine the melted solder area to prevent the solder from being wetted), an additional deposition or etching process can be omitted.

8 Claims, 8 Drawing Sheets

SOLDER TERMINAL AND FABRICATING METHOD THEREOF

BACKGROUND OF THE INVENTION

1. Field of the Invention

The present invention relates to a solder terminal structure and a method for fabricating the same and, more particularly, to a solder terminal structure and a fabrication method thereof to improve the reliability of a solder terminal.

2. Description of the Related Art

A so-called flip chip bonding technology is commonly used for semiconductor device packaging. The flip-chip bonding technology enables electrical and physical connection between a semiconductor chip and a substrate such as a ceramic substrate or a circuit board by simultaneously connecting corresponding terminals of the semiconductor chip and the substrate using solder balls or solder columns.

FIG. 1 is a cross-sectional view of a solder bump assembly to illustrate the connections between a semiconductor chip and a substrate using a conventional flip-chip bonding technology.

Referring to FIG. 1, solder balls 45 or solder bumps 40 electrically connect electrode (bond) pads 20 on a semiconductor device 30 and electrode pads 11 on a substrate 10. The solder balls 45 or solder bumps 40 are formed on one side or both sides of the semiconductor device 30 or substrate 10 and are connected to the corresponding electrode pads 20, 11 exposed through insulating films 50 that cover the semiconductor device 30 and the substrate 10.

A reference numeral "51" indicates an epoxy resin filled between the semiconductor device 30 and the substrate 10 to protect the semiconductor device 30 and substrate 10 from harmful environmental conditions such as electrical and physical impact.

To precisely control the volume and composition of the solder, the solder terminals are manufactured by selectively depositing or plating the solder using a mask formed of a metal or photoresist.

The solder bumps 40 formed on the semiconductor device 30 are generally separated into two areas of a solder terminal metal layer and a connection layer.

On the other hand, because metals such as aluminum, chrome, molybdenum or tungsten employed for wiring of the semiconductor device 30 do not flow or react well, the adhesion between the solder and the adjacent layers has been somewhat problematic.

FIG. 2A is a plan view showing the electrode pads 20 formed on the surface of the semiconductor device 30 and the solder bumps 40 connected to the electrode pads 20. Referring to FIG. 2A, the plurality of electrode pads 20 formed on the surface of the semiconductor device 30 are isolated from each other and exposed through the insulating layer 50. And a solder bump 40 is attached to the electrode pads 20 through the solder terminal (not shown). The position, number and size of the solder terminals are determined by a design rule of the semiconductor device 30 and the substrate 10, module reliability and the solder terminal forming process.

Conventionally, the total number of mutual connections used in a Very Large Scale Integration (VLSI) is about 1,000 and is expected to increase further. In line with current demands for high-speed and high-performance semiconductor devices, it is required that the electrode pads 20 of the semiconductor 30 have very high thermal and mechanical reliability.

FIG. 2B is an exemplary view showing the electrode pad 20 and a solder bump terminal on the semiconductor device 30 according to the prior art With reference to FIG. 2B, the semiconductor device 30 has at least one patterned wiring and a predetermined area of the wiring is exposed through the insulating layer 50 on the surface of the semiconductor device 30 to form the electrode pad 20. An adhesion metal layer 60 is formed on the insulating layer 50 and the electrode pad 20.

Also, a solder bonding layer 80 formed of a material for soldering forms a metallurgical bond by reacting with solder when the solder is heated. An intermediate layer 70 is formed between the adhesion metal layer 60 and solder bonding layer 80 to increase the bonding strength between the adhesion metal layer 60 and solder bonding layer 80, if necessary.

On the other hand, the solder bonding layer 80 reacts with at least one component of the solder bump 40 when the solder is melted, and forms an inter-metallic compound. When the solder is repeatedly melted numerous times, a Cu—Sn inter-metallic compound (not shown) grows thick and the metallurgical microstructure becomes coarse and discontinuous.

Therefore, in the prior art, if such a reaction continues, all of the solder bonding layer 80 can be changed into an intermetallic compound and a bonding strength of the solder bump 40 and adhesion metal layer 60 undesirably declines.

To prevent such a reduction in bonding strength of the solder bump 40 and the adhesion metal layer 60, the intermediate layer 70 is inserted between the solder bump 40 and adhesion metal layer 70 as discussed above. Conventionally, Cr—Cu is employed to form the intermediate layer 70.

With the conventional intermediate layer formed of, e.g., Cr—Cu, however, the Cu component in the Cr—Cu reacts with Sn in the solder and is thus removed, thus reducing the adhesion strength of the solder, especially, the strength of the solder where the solder contacts the other adjacent layers.

Further, with the prior art structure, there can be harmful reaction or interdiffusion between the electrode pad and the solder bonding layer, or between the adhesion layer and the solder bonding layer, which significantly degrades the device characteristics.

In addition, during the reliability test of the semiconductor devices, a probe mark may be left on the electrode (bond) pad. Because the area of the electrode pad where the probe mark is left is relatively thin, if a solder terminal of another material is directly mounted thereon, the electrode pad may be damaged by stress and chemical reaction between different materials.

SUMMARY OF THE INVENTION

Therefore, the present invention provides a solder terminal and a fabrication method thereof for solving problems and disadvantages of the conventional solder terminal structure.

According to an embodiment of the present invention, a solder terminal and a fabrication method thereof are provided to solve the problem discussed above.

The present invention also provides a solder terminal and a fabrication method thereof for acting as a solder dam that prevents a solder from being wetted and spreading without forming an additional metal layer for a solder terminal.

Therefore, the aluminum film of the electrode pad that becomes thinner by the probe mark can be compensated to the original thickness by mounting an adhesion metal layer of aluminum, which is identical to the material of the electrode pad, on the electrode pad. Thus, the problem can be solved and the stress can be minimized.

Additionally, the present invention provides a solder terminal structure and a fabrication method thereof, which can prevent the diffusion of aluminum from the electrode pad due to thermal loading, using a thermal diffusion barrier. Also, the thermal diffusion layer prevents the diffusion of aluminum from the electrode pad by electrical loading in semiconductor reliability test such as high temperature operation life (HTOL) acceleration test.

According to an embodiment of the present invention, a solder terminal structure comprises a plurality of electrode pads separated by an insulating layer on the surface of the semiconductor device chip, an adhesion metal layer formed over the electrode pads and the insulating layer adjacent to the electrode pad, a thermal diffusion barrier formed on the adhesion metal layer, a solder bonding layer formed on the thermal diffusion barrier and a solder bump formed on the solder bonding layer.

According to yet another embodiment of the present invention, a fabricating method comprises forming an insulating layer on a surface of a semiconductor device chip and exposing a plurality of electrode pads which are separated from each other by selectively etching the insulating layer, sequentially forming an adhesion metal layer, a thermal diffusion barrier and a solder bonding layer on the exposed electrode pad and the insulating film, coating photoresist layer on the upper portion of the solder bonding layer and patterning the photoresist layer by exposing and developing so that the solder bonding layer on the electrode pad is selectively exposed, plating solder on the exposed solder bonding layer, removing the patterned photoresist layer and etching the solder bonding layer, using the plated solder as a mask, and forming the solder bump by attaching the plated solder to the solder bonding layer, and etching the thermal diffusion barrier and the adhesion metal layer, using the solder bump as a mask.

According to still another embodiment of the present invention, a fabricating method comprises forming an insulating layer on a surface of a semiconductor device chip and exposing a plurality of electrode pads which are separated from each other by etching the insulating layer, forming an adhesion metal layer, a thermal diffusion barrier and a solder bonding layer on the exposed electrode pad and insulating film, coating photoresist layer over the solder bonding layer, patterning the photoresist layer by exposing and developing so that photoresist layer remains behind only on the solder bonding layer, etching the solder bonding layer using the residual photoresist layer as a mask, removing the residual photoresist layer, forming a first mask so that the exposed solder bonding layer can be selectively exposed, coating solder paste on the solder bonding layer selectively exposed by the first mask, removing the first mask, forming a solder bump by attaching the solder paste to the solder bonding layer, and etching the thermal diffusion barrier and adhesion metal layer, using the solder bump as a mask.

The foregoing and other objects, features, aspects and advantages of the present invention will become more apparent from the following detailed description of the present invention when taken in conjunction with the accompanying drawings.

BRIEF DESCRIPTION OF THE DRAWINGS

The foregoing and additional features and advantages of the present invention will become more readily apparent from the following detailed description of preferred embodiments thereof, which proceeds with reference to the attached drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
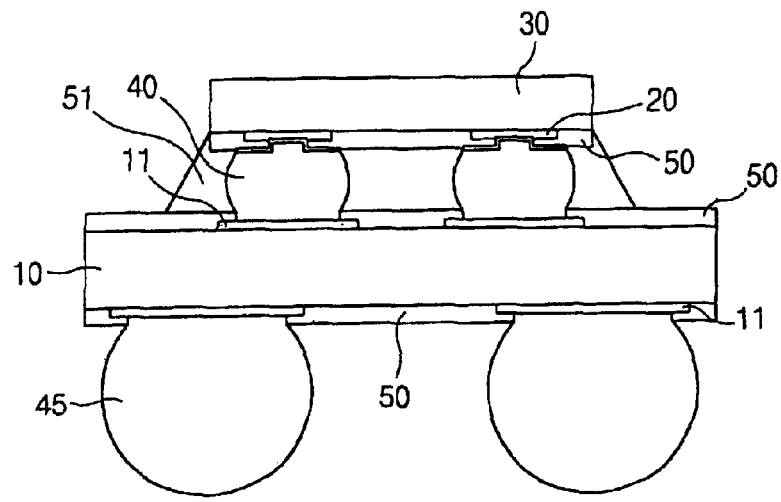
FIG. 1 is a cross-sectional view showing an assembly of a semiconductor device and a substrate with solder bump terminals according to a conventional flip chip bonding technique.
Figure 2A:
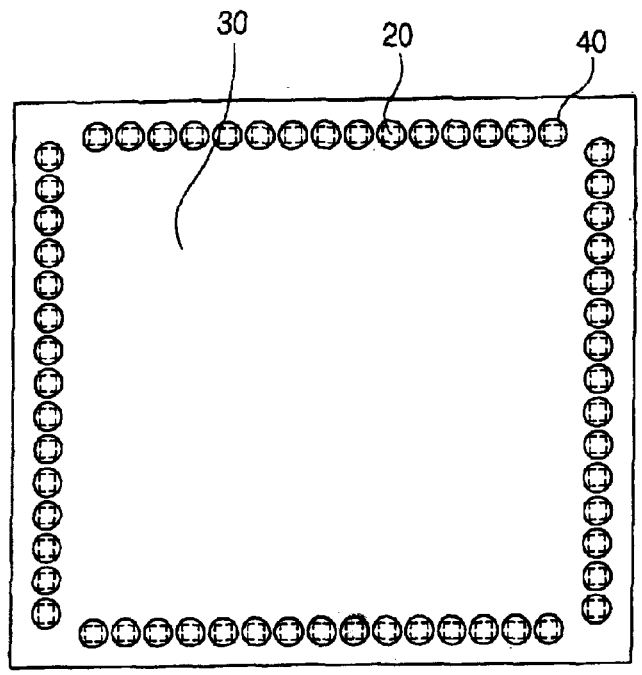
FIG. 2A is a plan view showing electrode pads formed on a surface of a semiconductor device with solder connected to the pads.
Figure 2B:
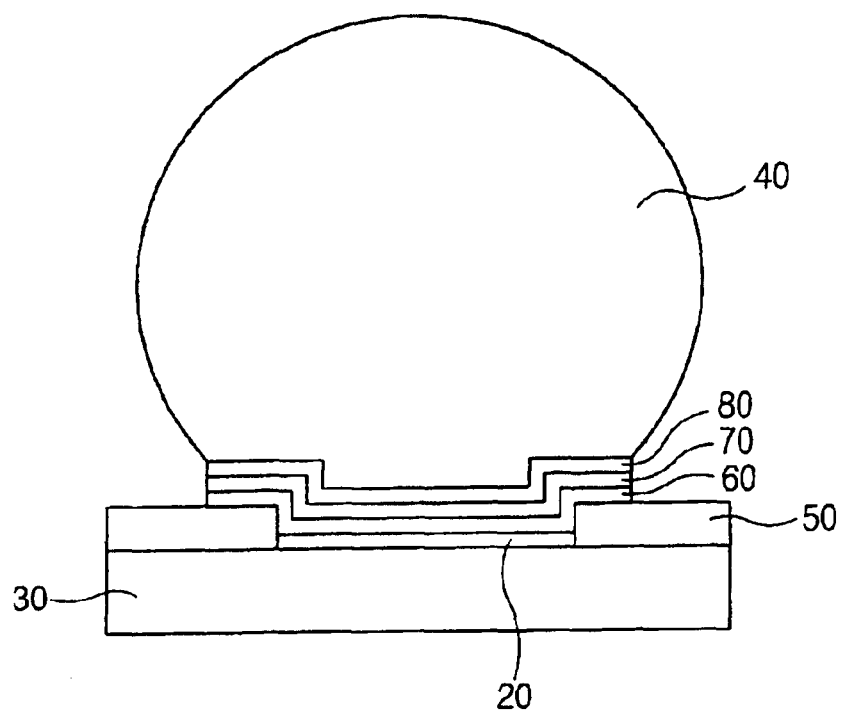
FIG. 2B is an exemplary view showing the general form of an electrode pad and solder bump terminal on a semiconductor device.
Figure 3A:
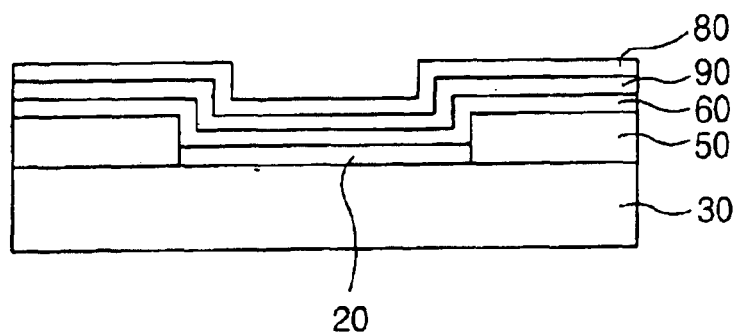
FIGS. 3A to 3G are cross-sectional views showing sequential steps of an embodiment of a fabrication process of a solder terminal in accordance with the present invention.

FIGS. 3A to 3G are cross-sectional views showing various stages of a fabrication process of a solder terminal in accordance with an embodiment of the present invention. Referring to FIG. 3A, after forming an insulating layer 50 on the surface of a semiconductor device 30, a plurality of electrode pads 20 which are separated from each other are exposed by selectively etching the insulating layer 50. Then, an adhesion metal layer 60, a thermal diffusion barrier 90 and a solder bonding layer 80 are sequentially formed on the resultant structure.

The semiconductor device 30 has at least one patterned wiring at the internal portion thereof and since only a particular area of the wiring is exposed through the insulating layer 50, the electrode pads 20 are formed on the surface of the semiconductor device 30. The adhesion metal layer 60 is formed of Al material or Al alloy material. The Al material fills any damaged area resulting from a probe mark on the aluminum electrode pad 20 during the yield and device characteristic test and acts as an adhesion metal layer 60.

Namely, since the aluminum film of the electrode pad 20 in which the probe mark is generated has a relatively thinner thickness than the aluminum film of other areas, in case other layers are directly mounted thereon and react at high temperature, or an excessive stress is received, defects can occur. Therefore, the adhesion metal layer 60 of Al or Al alloy material is formed on the aluminum film of the electrode pad 20 in accordance with an embodiment of the present invention. Thus, the aluminum film of the electrode pad 20 which became partly thinner due to the probe mark is restored to its original thickness. Thus, the reliability can be improved. It is preferred that the thickness of the adhesion metal layer be formed to a thickness thick enough to fill the probe mark, for example, about 100 to 5000 Å.

The solder bonding layer 80 is formed of a material that can retain adhesion strength by reacting with solder components and forming an intermetallic compound. This material can be, for example, a NiV material, or other suitable materials such as Ni—Cu, Ni—Fe, Ni—Cr. The solder bonding layer 80 can be formed of a Ni alloy material to a thickness of about 100 to 5000 Å.

On the other hand, the solder bonding layer 80 of NiV or Ni alloy material in accordance with an embodiment of the present invention can have an additional Au layer to prevent the surface of Ni from being oxidized on exposure to air.

Since the thermal diffusion barrier 90 is inserted between the adhesion metal layer 60 and the solder bonding layer 80, it is preferred that the barrier be formed of a material that does not diffuse or react with the Al or Al alloy material of the adhesion metal layer 60 and electrode pads 20 and the NiV or Ni alloy material of the solder bonding layer 80 and which prevents wetting by the melted solder, to avoid spreading or flowing of the solder. For example, the thermal diffusion barrier 90 may be comprised of TiW. Alternatively, it can be formed of Ti alloy material (for example, Ti—Al and TiN) and formed to a thickness of 100 to 5000 Å.

Generally, since TiW or Ti alloy material has a very strong bonding strength between Ti and W or among alloy elements added to Ti, the interdiffusion reaction is not generated even when a third metal is in contact therewith. The thermal diffusion barrier 90 of the TiW material or Ti alloy material is therefore formed between the adhesion metal layer 60 and the solder bonding layer 80. Accordingly, an interaction between the layers 60, 80 and 90 does not occur even when the thermal diffusion barrier 90 is heated to a temperature higher than 100° C.

Figure 3B:
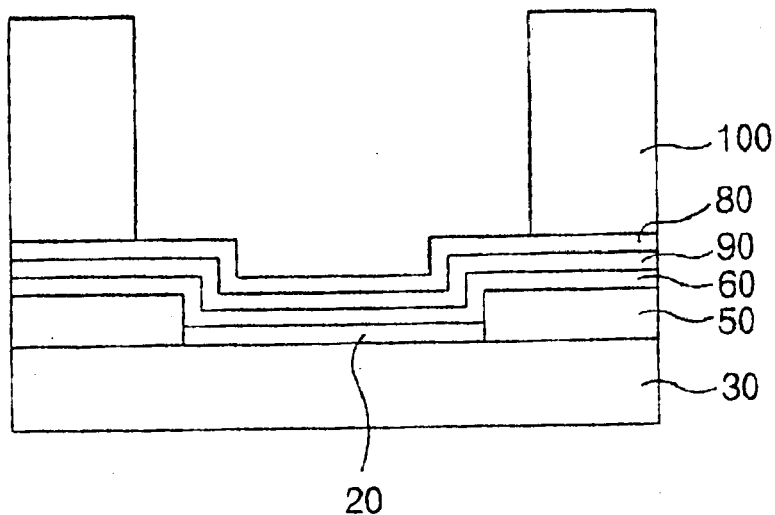

As shown in FIG. 3B, after coating a photoresist layer 100 on the solder bonding layer 80, the photoresist layer 100 is patterned by exposing and developing so that the solder bonding layer 80 overlying the electrode pad 20 is selectively exposed.

Figure 3C:
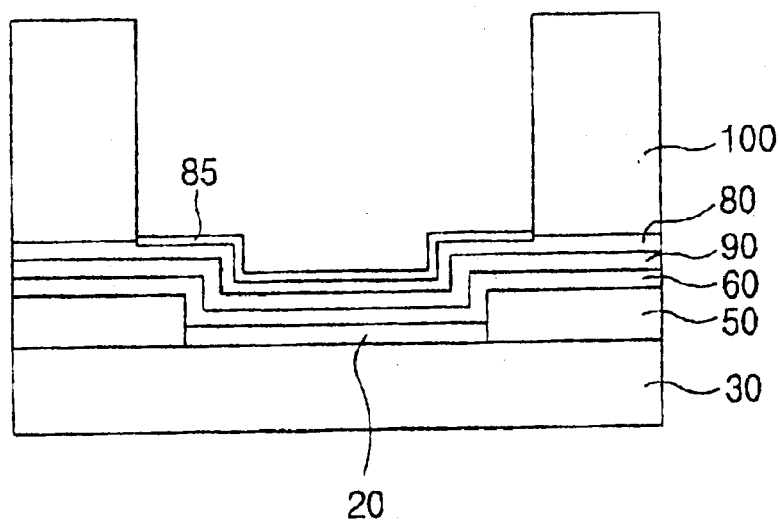

On the other hand, as shown in FIG. 3C, mechanical stability of the solder terminal can be improved by forming a layer of NiV or Ni alloy material 85 to a thickness of about 1 to 5 μm through an electrolytic or non-electrolytic plating method.

Figure 3D:
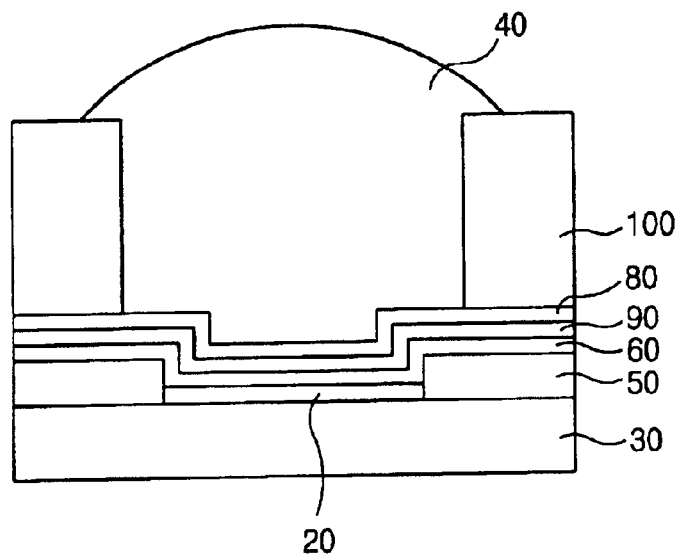

As shown in FIG. 3D, the solder 40 is plated on top of the exposed solder bonding layer 80 and the adjoining portion of the photoresist layer 100.

Figure 3E:
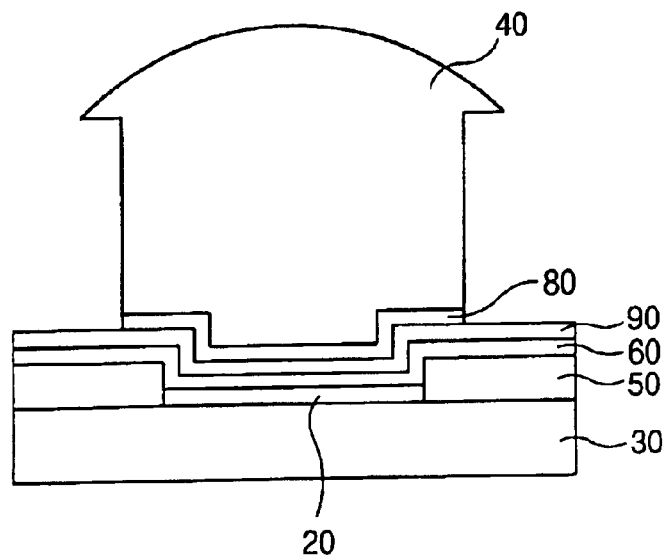

As shown in FIG. 3E, after removing the patterned photoresist layer 100, the solder bonding layer 80 of NiV or Ni alloy material is etched by using the plated solder 40 as a mask.

At this time, in the resultant structure where the solder bonding layer 80 is etched, the uppermost layer on which the solder 40 is not formed is the thermal diffusion barrier 90 of TiW or Ti alloy material. On the thermal diffusion barrier 90, the solder 40 is not wettable, i.e., it does not spread or flow on when the solder 40 is melted. Therefore, as shown in FIG. 3F, even when the solder 40 is melted, the solder 40 does not wet, spread, or flow to the thermal diffusion barrier 90 of TiW or Ti alloy material and it remains on the solder bonding layer 80 of NiV or Ni alloy material in a spherical form (solder ball or bump form).

Thus, the thermal diffusion barrier 90 of TiW or Ti alloy material in accordance with an embodiment of the present invention acts as a thermal diffusion barrier 90 as well as a solder dam. Also, the thermal diffusion barrier 90 which is mounted on the electrode pads 20 and the adhesion metal layer 60 of Al material or Al alloy material can provide mechanical and thermal stability to the electrode pads 20 and facilitating the solder bumping process because TiW is used as a diffusion barrier for Al at high temperatures as hundreds of degrees Celsius in the wiring process of the semiconductor device, and does not react with the solder 40 materials such as Sn or Pb and the melted solder 40 is not wettable, i.e., it does not spread or flow. Thus, the thermal diffusion barrier layer 90 can simultaneously act as a thermal diffusion barrier and a solder dam.

Figure 3F:
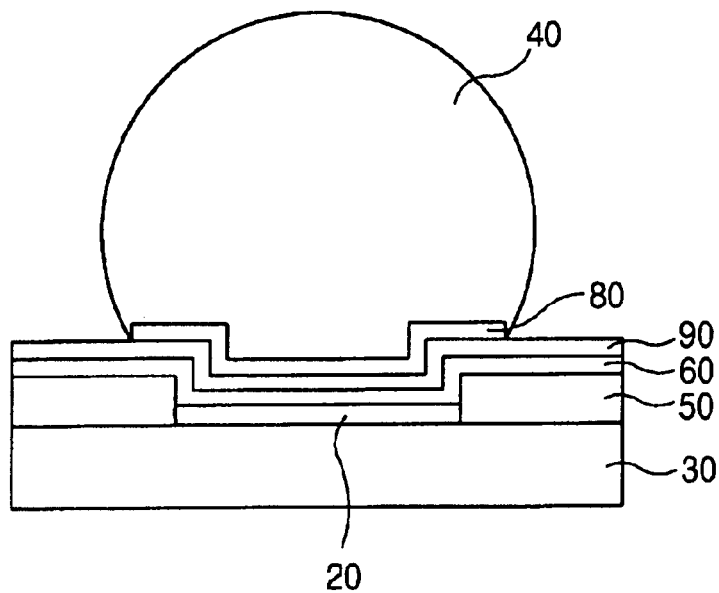

Then, as shown in FIG. 3F, the spherical solder bump 40 is formed by melting the plated solder 40 onto the solder bonding layer 80.

Figure 3G:
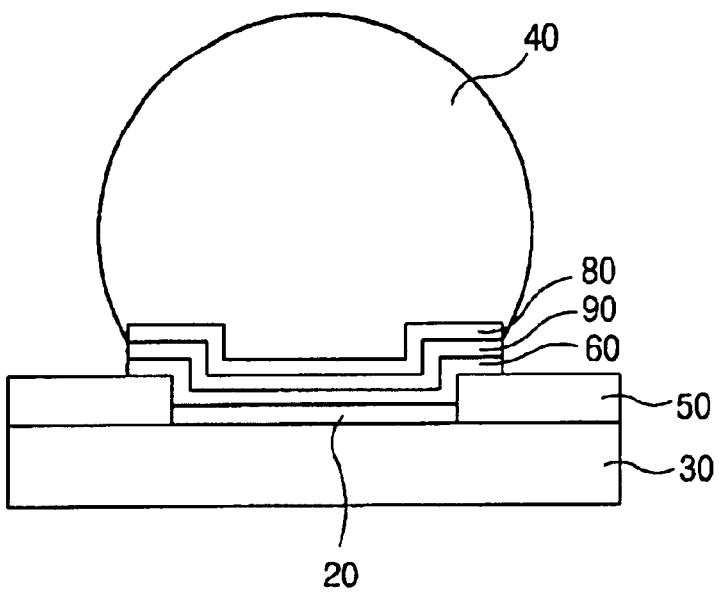

Lastly, as shown in FIG. 3G, the solder terminal in accordance with a desirable embodiment of the present invention is fabricated by etching the thermal diffusion barrier 90 and the adhesion metal layer 60 using the solder bump 40 as a mask.

On the other hand, FIGS. 4A to 4G are cross-sectional views showing sequential steps of a fabrication process of a solder terminal in accordance with another embodiment of the present invention.

Figure 4A:
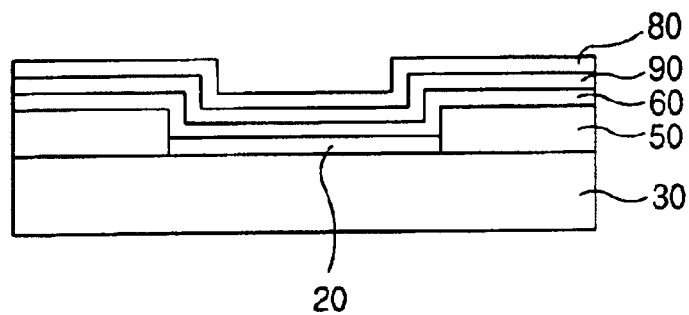
FIGS. 4A to 4G are cross-sectional views showing sequential steps of another embodiment of a fabrication process of a solder terminal in accordance with the present invention.

Referring to FIG. 4A, after forming an insulating layer 50 on the surface of a semiconductor device 30, a plurality of electrode pads 20 which are separated from each other are exposed by selectively etching the insulating layer 50. Then, an adhesion metal layer 60, a thermal diffusion barrier 90 and a solder bonding layer 80 are sequentially formed on the resultant structure. The kind and deposition thickness of the adhesion metal layer 60, thermal diffusion barrier 90 and solder bonding layer 80 are the same as the previously described embodiment shown in FIG. 3A.

Figure 4B:
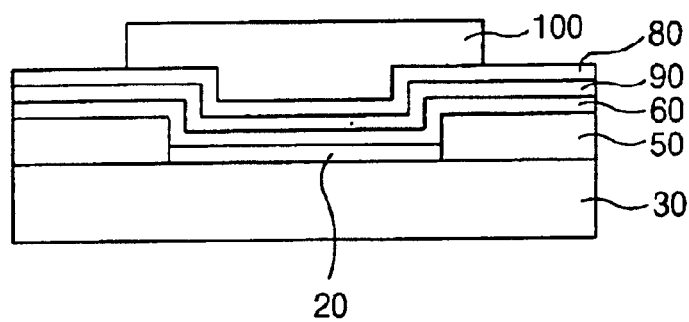

As shown in FIG. 4B, a photoresist layer 100 is coated on the solder bonding layer 80 using conventional technique. Then, by exposing and developing, the photoresist layer 100 is selectively patterned such that the photoresist layer 100 remains only at the upper portion of the solder bonding layer 80 above the electrode pads 20. Next, by using the photoresist layer 100 as a mask, the solder bonding layer 80 is etched. Therefore, the area where the solder bonding layer 80 is etched away exposes the thermal diffusion barrier 90 of TiW or Ti alloy material, the uppermost layer.

Figure 4C:
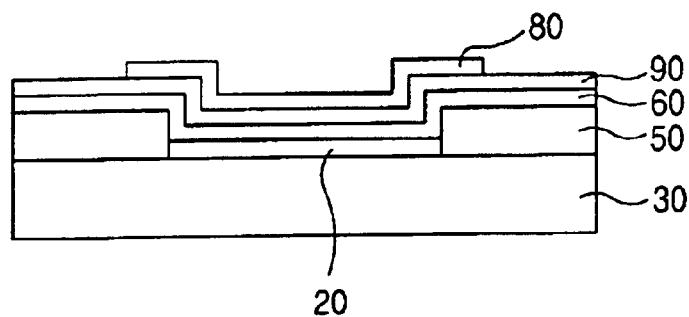

Then, as shown in FIG. 4C, the remaining solder bonding layer 80 is exposed by removing the patterned photoresist layer 100.

Figure 4D:
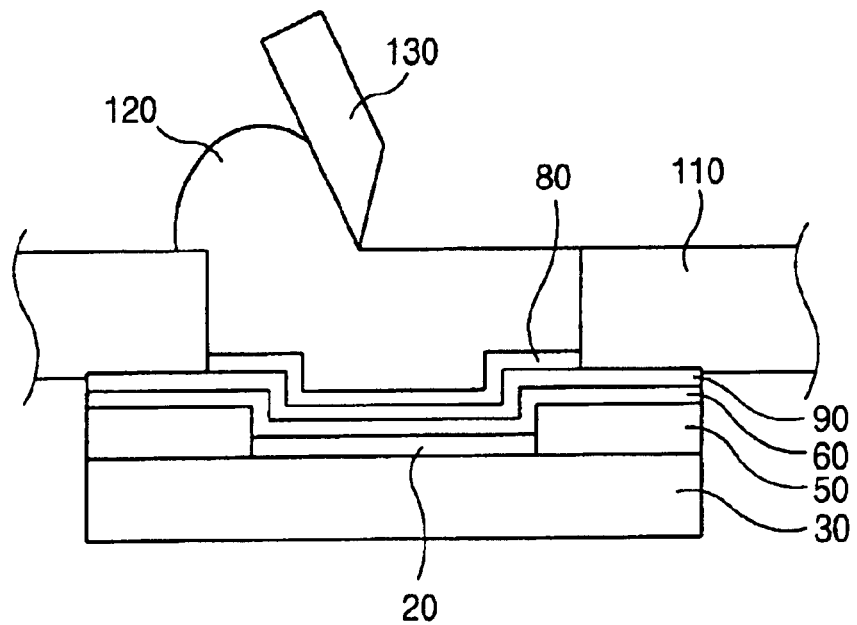

As shown in FIG. 4D, after installing or forming a stencil mask 110 so that the solder bonding layer 80 is selectively exposed and the area of the thermal diffusion barrier 90 exposed by etching the solder bonding layer 80 is covered, a solder paste 120 containing flux is selectively coated onto the solder bonding layer 80 by, for example, a printing method using a blade 130.

Figure 4E:
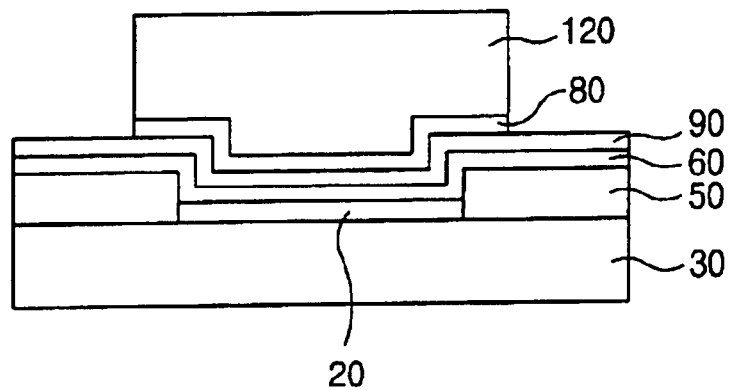

As shown in FIG. 4E, the stencil mask 110 is then removed.

Figure 4F:
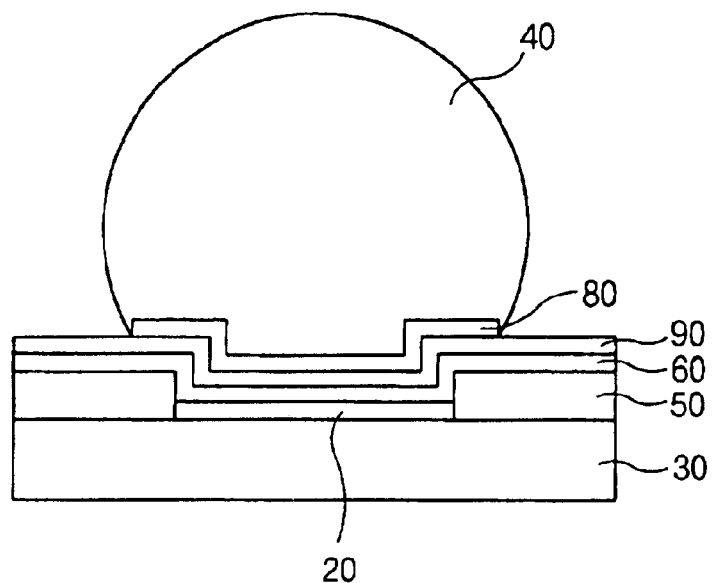

As shown in FIG. 4F, by melting the solder paste 120 and attaching it to the solder bonding layer 80, the spherical solder bump 40 is formed. Because the solder paste 120 is not coated on the thermal diffusion barrier 90 in which the uppermost layer is made of TiW or Ti alloy material, the solder paste 120 is not wettable, i.e. it does not flow or spread. Thus, the solder paste 120 reacts only with the solder bonding layer 80.

Figure 4G:
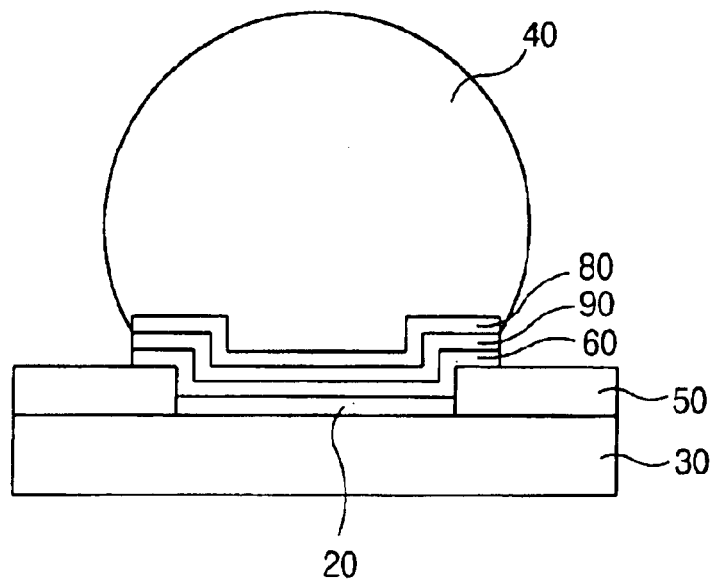

Lastly, as shown in FIG. 4G, the solder terminal according to an embodiment of the present invention is fabricated by etching the thermal diffusion barrier 90 and the adhesion metal layer 60 using the solder bump 40 as a mask.

The solder terminal and the fabrication method thereof in accordance with the present invention have an advantage in that they can prevent the degradation of the device characteristics caused by the probe mark generated on the electrode pad, and can minimize material movement, i.e., interdiffusion between the layers of the electrode pad, the solder bonding layer and the adhesion metal layer during a semiconductor reliability test, using the thermal diffusion barrier formed of TiW or Ti alloy material.

Also, by having the thermal diffusion barrier act as the solder dam (a layer to confine the melted solder area to prevent the solder from wetting, spreading, or flowing) an additional metal layer deposition or etching process can be omitted.

The present invention also has an advantage in that stress can be minimized by restoring the thickness of the portion of the aluminum film that becomes thinner by the probe mark back to its original thickness by forming the adhesion metal layer of the same material as the material for the electrode pads.

Also, with the thermal diffusion barrier, interdiffusion between electrode pads and the solder bonding layer or between the adhesion layer and the solder bonding layer can be prevented for a temperature range of 50–350° C., for example, during a solder reflow process (about 200–350° C.) or electrical loading, for example, as in a high-temperature reliability test such as HTOL acceleration test (50–150° C.).

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A solder terminal structure, comprising:
   a plurality of electrode pads exposed through an insulating layer on a surface of a semiconductor device chip;
   an adhesion metal layer formed on the electrode pads and on the insulating layer adjacent to the electrode pad, wherein the adhesion metal layer comprises Al or Al alloy material:
   a thermal diffusion barrier formed on the adhesion metal layer, wherein the thermal diffusion barrier comprises a TiW or Ti alloy material;
   a solder bonding layer formed on the thermal diffusion barrier, wherein the solder bonding layer is comprises a NiV material; and
   a solder bump formed on the solder bonding layer,
   wherein the thermal diffusion barrier does not substantially reach with either the electrode pad, the solder bump during a solder reflow process or a high-temperature semiconductor reliability test.

2. The structure of claim 1, wherein the thermal diffusion barrier prevents interdiffusion between the solder bonding layer and the electrode pads, and between the adhesion metal layer and the solder bonding layer at the temperature of about 50–350° C.

3. The structure of claim 1, wherein the thermal diffusion barrier is also a wetting barrier layer such that the solder bump is not wettable during the solder reflow process or the high temperature reliability test.

4. The structure of claim 1, further comprising:
   a NiV material or Ni alloy material layer formed on the upper portion of the solder bonding layer.

5. The structure of claim 1, further comprising:
   an oxidation barrier of Au formed on the surface of the solder bonding layer.

6. A solder terminal structure, comprising:
   a plurality of electrode pads exposed through an insulating layer on a surface of a semiconductor device chip;
   an Al adhesion metal layer formed on the electrode pads and on the insulating layer adjacent the electrode pad;
   a thermal diffusion barrier formed on each adhesion metal layer, the thermal diffusion layer formed of TiW or Ti alloy;
   a solder bonding layer formed on the thermal diffusion barrier, the solder bonding layer formed of NiV material; and
   a solder bump attached to the solder bonding layer, wherein the thermal diffusion barrier does not substantially reach with either the electrode pads or the solder bump during a solder reflow process or a high-temperature semiconductor reliability test.

7. The structure of claim 6, further comprising:
   a NiV material or Ni alloy material layer formed on the upper portion of the solder bonding layer.

8. The structure of claim 7, further comprising:
   an oxidation barrier of Au material formed on the solder bonding layer.

* * * * *